(12) United States Patent
Ahrenkiel et al.

(10) Patent No.: US 8,581,613 B2
(45) Date of Patent: Nov. 12, 2013

(54) TRANSMISSION-MODULATED PHOTOCONDUCTIVE DECAY MEASUREMENT SYSTEM

(75) Inventors: Richard Keith Ahrenkiel, Lakewood, CO (US); Donald John Dunlavy, Arvada, CO (US)

(73) Assignee: Colorado School of Mines, Golden, CO (US)

( * ) Notice: Subject to any disclaimer, the term of this patent is extended or adjusted under 35 U.S.C. 154(b) by 284 days.

(21) Appl. No.: 12/694,914

(22) Filed: Jan. 27, 2010

(65) Prior Publication Data

US 2010/0283496 A1  Nov. 11, 2010

Related U.S. Application Data

(60) Provisional application No. 61/147,689, filed on Jan. 27, 2009.

(51) Int. Cl.
*G01R 31/302* (2006.01)

(52) U.S. Cl.
USPC ............. 324/754.31; 324/762.01; 324/754.23

(58) Field of Classification Search
USPC .............. 324/762.01–762.02, 754.23, 754.31
See application file for complete search history.

(56) References Cited

U.S. PATENT DOCUMENTS

| | | | | |
|---|---|---|---|---|
| 4,949,034 A | * | 8/1990 | Imura et al. | 324/754.08 |
| 5,049,816 A | * | 9/1991 | Moslehi | 324/762.02 |
| 5,384,543 A | * | 1/1995 | Bible et al. | 324/644 |
| 5,406,214 A | | 4/1995 | Boda et al. | |
| 5,451,886 A | * | 9/1995 | Ogita et al. | 324/754.23 |
| 5,867,034 A | * | 2/1999 | Sokolov et al. | 324/754.23 |
| 5,929,652 A | | 7/1999 | Ahrenkiel | |
| 6,275,060 B1 | | 8/2001 | Ahrenkiel et al. | |
| 6,369,603 B1 | * | 4/2002 | Johnston et al. | 324/754.31 |

OTHER PUBLICATIONS

Ahrenkiel et al., *Solar Energy Materials and Solar Cells*, 92, 830-835, 2008.
Ahrenkiel, "Minority Carriers in III-V Semiconductors: Physics and Applications," *Semiconductors and Semimetals*, Willardson Beer Series, Academic Press, V 39, 39-150, 1993.
Ahrenkiel et al. *Materials Science and Engineering*, B102, 161-172, 2003.
Metzger et al., *Journal of Applied Physics*, V 94, No. 5, 3549-55, 2003.
Sinton et al. *Appl. Phys. Lett.*, 69, 2510, 1996.

* cited by examiner

*Primary Examiner* — Arleen M Vazquez
(74) *Attorney, Agent, or Firm* — Lathrop & Gage LLP (57) ABSTRACT

A system and method for measuring recombination lifetime of a photoconductor or semiconductor material in real time and without physically contacting the material involving positioning the sample material between a transmitter and a receiver so that electromagnetic signals, preferably radio frequency signals, traveling from the transmitter to the receiver pass through the sample material. The electromagnetic signals are modulated as they pass through the sample material depending on the carrier density and conductivity of the sample material. The modulated electromagnetic signals received by the receiver are then analyzed to determine the carrier recombination lifetime of the sample material.

21 Claims, 7 Drawing Sheets

TRANSMISSION-MODULATED PHOTOCONDUCTIVE DECAY MEASUREMENT SYSTEM

CROSS REFERENCE TO RELATED APPLICATIONS

This application claims the benefit of U.S. provisional application 61/147,689, filed Jan. 27, 2009; which is hereby incorporated by reference to the extent not inconsistent with the present disclosure.

BACKGROUND

In the field of semiconductors, carrier generation and recombination are processes by which mobile charge carriers (electrons and electron holes) are created and eliminated. Recombination lifetime refers to how long the generated charge carriers, such as photocarriers in photovoltaic (PV) devices, last before returning to an energy neutral state.

Recombination lifetime, also referred to as carrier lifetime, is one of the most critical diagnostic parameters for predicting the performance of PV devices. Each product technology has specific recombination lifetime requirements with respect to the production of efficient PV converters. The dominant PV products being sold in the marketplace are typically based on silicon wafers produced by different growth methods. For residential applications, the industry compromises efficiency while maximizing the efficiency-to-cost ratio. The dominant loss mechanism that affects low-cost silicon photovoltaics is the impurity-related or defect-related Shockley-Read-Hall (SRH) recombination.

Efficiency and performance of PV devices are heavily dependent on the wafer material's photocarrier recombination lifetime, which itself is a very strong function of material purity, growth, and post-growth processing. Recombination lifetime is highly dependent on impurities and defects within a photoconducting material. For example, photocarriers induced in a sample can recombine at sites of impurities or defects in a material, thereby decreasing the photocarrier lifetime and producing unwanted heat within the material.

Thus, the recombination lifetime of photocarriers in a photoconducting sample is a useful parameter for determining the purity of the wafer material and subsequent efficiency of the PV device. A significant component of the cost of manufacturing photovoltaic materials is the loss associated with processing an inferior wafer material and consequently having to discard an entire production run because of substandard performance. Therefore, measurement of the recombination lifetime of a sample is useful as a quality control measure of a material, provided the measurement is accurate, fast and carried out in a non-invasive manner.

There are a number of techniques that are currently in use for contactless measurements of photocarrier recombination lifetime in photovoltaic materials. For example, U.S. Pat. No. 5,406,214, issued Apr. 11, 1995 to Boda et al discloses a microwave-based technique and is directed to a contactless apparatus and method for measuring minority carrier recombination lifetime in semiconducting materials using a tuned source of microwave energy. However, microwave-based techniques for measuring recombination lifetimes are currently limited to silicon materials, and although microwave reflection techniques have the ability to measure lifetimes in the nanosecond range, they have a very small dynamic range [See Ahrenkiel et al., *Solar Energy materials and Solar Cells*, 92, 830-835, 2008].

Similarly, quasi-steady state photoconductivity (QSSPC) techniques, such as that described by Sinton et al. [*Appl. Phys. Lett.*, 69, 2510, 1996], are designed for measuring recombination lifetimes of silicon only and may not apply to other photovoltaic materials.

Another recombination lifetime measurement technique involves time-resolved photoluminescence (TRPL) [See e.g., Metzger et al., *Journal of Applied Physics*, V 94, no. 5, 3549-55, 2003; and Ahrenkiel, "Minority Carriers in III-V Semiconductors: Physics and Applications," *Semiconductors and Semimetals*, Willardson Beer Series, Academic Press, V 39, 39-150, 1993], which is capable of measuring recombination lifetimes of compound semiconductor thin films in most cases. However, this technique is only applicable to direct bandgap materials and is not applicable to silicon, germanium, and other indirect bandgap materials.

U.S. Pat. No. 5,929,652, issued Jul. 27, 1999 to Ahrenkiel discloses an apparatus for determining the minority carrier lifetime of a semiconducting sample using an oscillator providing a high frequency voltage signal to a bridge circuit having a wire coil that produces a variable mutual impedance between a sample and the coil. The technique disclosed in this patent is herein referred to as "Resonance Coupled Photoconductive Decay" ("RCPCD"), and is further disclosed in U.S. Pat. Nos. 6,275,060 and 6,369,603, and Ahrenkiel et al. [*Materials Science and Engineering*, B102, 161-172, 2003]. The RCPCD technique is applicable to silicon wafers and films, and is useful for materials with lifetimes larger than about 30-50 ns. However, this technique may not be able to measure lifetimes in the shorter lifetime ranges that are commonly found in compound semiconductor materials and thin film silicon.

As recombination lifetime is a significant component of production yield and product cost, manufacturers of solar cells and other PV products would benefit from the ability to measure the recombination lifetime of every wafer or film prior to incorporating it an assembly line. However, there has previously been no diagnostic means available that allows for quick analysis of recombination lifetime applicable to a wide range of materials. A compromise has been reached that involves sampling photoconductive wafers at an economically practical rate in an attempt to minimize defective products, and stopping the assembly line when the material quality falls below specification. Therefore, there is a need for an improved high speed, non-invasive means for measuring the recombination photocarrier lifetime of a material, having a large dynamic range and an improved response to short-lifetime materials (such as materials having carrier lifetimes less than 50 ns), applicable to a wide range of photoconducting and semiconducting materials (such as materials used in the microelectronic and optoelectronic industries, as well as in photovoltaic industries).

SUMMARY

The present invention provides systems and methods for measuring recombination lifetime of a photoconductor or semiconductor material, preferably in real time and without physically contacting the material, involving positioning the sample material between a transmitter and a receiver so that electromagnetic signals, preferably radio frequency signals, traveling from the transmitter to the receiver pass through the sample material. The electromagnetic signals are modulated as they pass through the sample material depending on the carrier density and conductivity of the sample material. The modulated electromagnetic signals received by the receiver are then analyzed to determine the carrier recombination lifetime of the sample material.

In one embodiment, the present invention provides a system for measuring the carrier recombination lifetime of a semiconductor sample material comprising a transmitter able to transmit an electromagnetic signal and means for positioning the sample material in electromagnetic communication with the transmitter. The electromagnetic signal is transmitted from the transmitter through the sample material. The system also comprises an energy source positioned so as to radiate energy toward the sample material. The radiated energy is able to generate carriers (electrons and electron holes) in the sample material. These generated carriers are able to modify or modulate the electromagnetic signal transmitted through the sample. A receiver is able to receive the modified electromagnetic signal from the sample material where it is analyzed to determine the carrier recombination lifetime. Preferably, the electromagnetic signal is a radio frequency signal.

The invention also provides a transmission-modulated photoconductive decay (TMPCD) system to determine the photocarrier recombination lifetime of a photoconductive sample material. In this embodiment, a light source, such a laser or other pulsed light source, is used to excite the sample material and generate photocarriers. The electromagnetic signals transmitted through the sample material from the transmitter to the receiver are a function of the induced photocarrier density and photoconductivity of the sample material. This system provides a nondestructive, contactless means to measure the recombination lifetime in, or very close, to real time for a wide range of semiconducting and photoconducting materials. The response time or rise time is 10 ns or less, preferably at or below approximately 5 ns. The recombination lifetime resolution limit is less than currently known methods, such as Resonance Coupled Photoconductive Decay (RCPCD), and has greater or equal sensitivity.

Preferably, the electromagnetic signal is a radio frequency signal. In one embodiment, the invention uses two radio frequency coils, operating between approximately 200 MHz and 900 MHz, preferably at or between about 400 MHz and 700 MHz. One coil is used as a transmitter antenna and the second coil as a receiver antenna. Both coils are mounted in shielded cavities and are shielded from each other. The photoconducting sample is mounted above the intra-coil shield and acts as a waveguide or conduit for radio frequency energy transfer between the transmitting coil and the receiving coil. The transmitted radio frequency signal is modulated by optically induced photoconductivity in the sample. Using a fast, pulsed light source, the transmitted signal amplitude tracks the photoinduced carriers in real time. The high frequency radio frequency signal at the receiving coil is converted into a transient DC signal that is a measure of the photocarrier density as a function of time. This signal is observed and stored, such as on an oscilloscope, for further analysis. By analyzing the decay time of the transient signal, the carrier recombination lifetime can be measured.

In one embodiment, the present invention provides a system for measuring the photocarrier recombination lifetime of a photoconductive sample material comprising a transmitter able to transmit an electromagnetic signal, and positioning means for positioning the sample material in electromagnetic communication with the transmitter, wherein the electromagnetic signal is transmitted from the transmitter through the sample material. A light source is placed in optical communication with the sample material, wherein the light source is able to generate photocarriers in the sample material. The light source can be any light source able to induce photocarriers in a photoconductive material. Preferably the light source is a pulsed light source such as a laser. The generated photocarriers are able to modify or modulate the electromagnetic signal transmitted through the sample. The measuring system further comprises a receiver able to receive the modified electromagnetic signal, and means for analyzing the received modified signal to determine the photocarrier recombination lifetime.

The sample positioning means is a platform or holder or any other means known in the art for holding the sample in electromagnetic communication with the transmitter and receiver. The sample material does not need to be in direct physical contact with either the transmitter or receiver; however, the sample material should be positioned so that it is touching or is close enough to the transmitter and receiver to allow the electromagnetic signal to be transmitted from the transmitter to the receiver through the sample material. The modified signal received by the receiver should be of sufficient quality to provide meaningful analysis by the analyzing means. In one embodiment, the sample material does not contact the transmitter or receiver and the system provides a contactless means for measuring the recombination lifetime of the sample.

The analyzing means can be any electronic or computer means known in the art used to detect and analyze electronic signals. The analyzing means can optionally comprise a graphical display device for displaying information representing carrier lifetime of a sample.

The measurement system can also comprise an electromagnetic shield positioned between the transmitter and receiver so as to ensure that the receiver only receives electromagnetic signals transmitted through the semiconductor or photoconductor material. Selection, conformation and positioning of such shield can be readily determined by one of ordinary skill in the art without undue experimentation.

In one embodiment of the invention, the measurement system also comprises a radio frequency oscillator electrically coupled to the transmitter for producing the radio frequency signals. The measurement system can also comprise a signal splitter electronically coupled to the radio frequency oscillator and the transmitter for producing first and second identical electromagnetic signals. The first signal is provided to the transmitter while the second signal is provided as a reference signal. A signal mixer is placed in direct or indirect electronic signal communication with the receiver, which provides an electronic data signal to the mixer. The data signal carries information representing the modified electromagnetic signal received by the receiver. The mixer is also in direct or indirect electronic signal communication with the splitter and is able to receive the reference signal. The measuring system optionally also comprises means for comparing the data signal and the reference signal received by the mixer and means for converting the information to a display representing the recombination lifetime of the sample material. The means for comparing the signals and displaying the results can be any electronic or computer means known in the art. Preferably, a phase shifter is placed in electronic signal communication with either the splitter or the receiver and matches the phases of the reference signal and data signal to produce a matched-phase signal for sending to the mixer.

Additionally, the measurement system optionally comprises a first amplifier in direct or indirect electronic signal communication with the receiver for amplifying the data signal and/or a second amplifier in direct or indirect electronic signal communication with the splitter for amplifying the reference signal. The amplified data signal and/or reference signal is then transmitted to the mixer.

Also provided herein is a method for measuring photocarrier recombination lifetime of a photoconductor sample material comprising the steps of: positioning the sample material between a transmitter and a receiver; transmitting an electromagnetic signal from the transmitter through the sample material; generating photocarriers in the sample material, wherein the photocarriers modify the electromagnetic signal; and analyzing the modified electromagnetic signal received by the receiver to determine the photocarrier recombination lifetime of the sample material. Preferably the electromagnetic signal is a radio frequency signal. Preferably, the radio frequency signal has a frequency between approximately 200 MHz and 900 MHz, more preferably at or between about 400 MHz and 700 MHz.

In a further embodiment, the method comprises generating photocarriers which modify the amplitude of the electromagnetic signal transmitted through the sample, and analyzing the amplitude-modified signals received by the receiver to determine the photocarrier recombination lifetime of the sample.

Optionally, the method also comprises generating a reference signal identical to the electromagnetic signal and comparing the reference signal to the modified electromagnetic signal received by the receiver. Additionally, a data signal may be generated from the modified electromagnetic signal received by the receiver and the phases of the reference signal and data signal matched. The reference signal, data signal, or both signals can be amplified to improve the analysis.

In addition to the exemplary aspects and embodiments described above, further aspects and embodiments will become apparent by reference to the drawings and by study of the following descriptions.

DETAILED DESCRIPTION OF THE INVENTION

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general the terms and phrases used herein have their art-recognized meaning, which can be found by reference to standard texts, journal references and contexts known to those skilled in the art. The following definitions are provided to clarify their specific use in the context of this disclosure.

The term "direct signal communication" between a first and second element means that the second element receives an electronic or electromagnetic signal directly from the first element. "Indirect signal communication" between a first and second element means that there are one or more intervening elements that receive, possibly modify, and transmit the signal from the first element before it is received by the second element.

The term "electrically coupled" refers to an element that is directly or indirectly connected to a second element so that an electric signal or electric current can be transmitted to the second element. Similarly, the term "electromagnetic communication" refers to a first element able to send electromagnetic signals or electromagnetic energy to a second element. The first and second elements may be directly connected or there may be one or more intervening elements that receive, possibly modify, and transmit the electromagnetic signal or element from the first element before it is received by the second element.

The term "in optical communication" means that one element is able to transmit optical energy, such as light, to a second element.

The term "semiconductor" refers to a class of materials that exhibit electrical conductivity between that of a conductor and an insulator. The conductivity of a semiconductor may be increased by exposing the semiconductor to energy, such as optical energy for photoconductors. The energy absorbed by the semiconductor generates excess electron-hole pairs within the material, which accounts for the increased conductivity. The conductivity of a semiconductor is proportional to the densities of electrons and holes. Electrons and holes induced by a source of optical energy are referred to herein as "photocarriers," which is also used interchangeably with the term "carriers." A semiconductor material can be "doped" to increase the number of holes or electrons by adding a chemical impurity. An "n-doped semiconductor" is a semiconductor that has been doped with electrons, and a "p-doped semiconductor" is a semiconductor that has been doped with holes. In a doped semiconductor, the particle (electron or hole) that has been increased in number by chemical doping is referred to as the "majority carrier," and the opposite type particle is referred to as the "minority carrier."

The terms "photoconductor" and "photoconductivity" as used herein refer to a class of materials and a property of materials that exhibit electrical conductivity when exposed to electromagnetic energy, such as optical energy. Examples of photoconductors include: semiconductors, including wide bandgap semiconductors.

The terms "recombination photocarrier lifetime," "recombination lifetime," "photocarrier lifetime," "carrier lifetime," and "lifetime" are used synonymously and refer to the average time it takes for an excess photocarrier to recombine with another photocarrier of opposite charge. For a doped semiconductor, the recombination lifetime is more specifically referred to as the "minority carrier lifetime," which refers to the average time it takes for an excess minority carrier to recombine with a majority carrier.

The terms "contactless" refers to a measurement system which is capable of measuring recombination lifetimes in a non-destructive and non-invasive manner. For example, a contactless measurement system does not require the sample to be in contact with the means for measuring the recombination lifetime of the sample. The TMPCD measurement systems provided herein measure the recombination lifetime of a sample with a transmitter and receiver for transmitting radio frequency energy and receiving radio frequency energy through an illuminated sample. The sample is not required to be, and preferably is not in physical contact with the light source for illuminating the sample, the transmitter or receiver.

The term "transient photoconductive decay" refers to the time-varying photoconductive decay that occurs as the light-induced carriers recombine.

Figure 1:
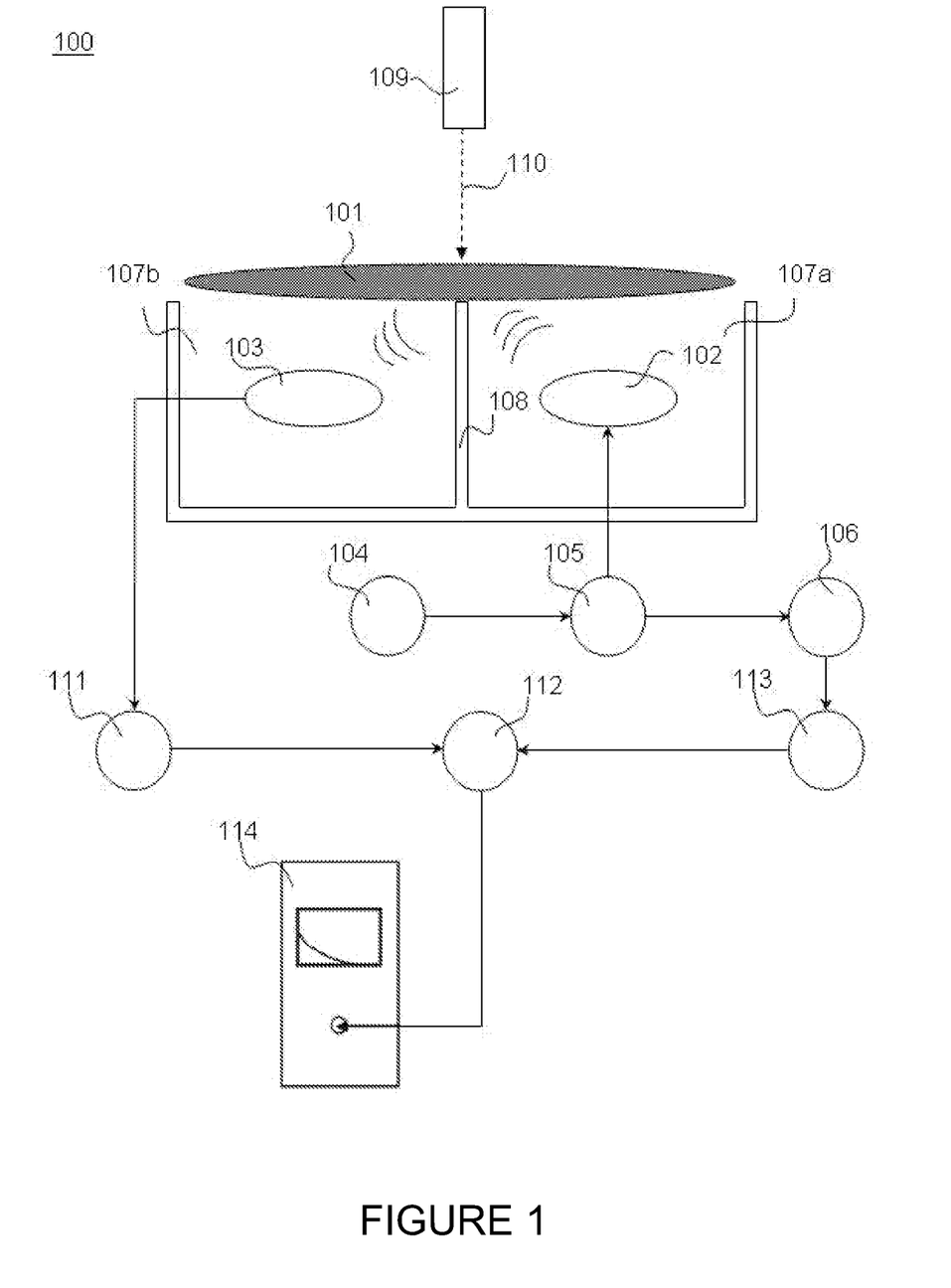
FIG. 1 is a schematic diagram of a transmission-modulated photoconductive decay (TMPCD) measurement system provided herein.

FIG. 1 is a schematic diagram of a transmission-modulated photoconductive decay (TMPCD) measurement system 100 for measuring the photocarrier recombination lifetime of a photoconducting sample material 101 using two radio frequency antennas: a transmitter 102 and a receiver 103. In this example, the transmitter 102 and receiver 103 do not contact the sample material 101 but are positioned close enough to the sample material 101 to allow electromagnetic signals to be transmitted to the sample material 101 from the transmitter 102, and to allow the receiver 103 to receive a signal of sufficient quality to provide a meaningful display of the photocarrier lifetime measurement as described below. As shown in FIG. 1, the TMPCD measurement system 100 includes a radio frequency oscillator 104 which outputs an electronic signal at radio frequencies. Preferably, the frequency of the oscillator is tunable and operates at a constant frequency selected over the range of 400 MHz to 700 MHz. In a specific embodiment, the radio frequency oscillator 104 is tuned to emit a 600 MHz electronic signal. However, the frequency of the electronic signal created by the radio frequency oscillator 104 is a variable that can be optimized by the user such that the signal frequency provides the maximum interaction with the photocarriers in the semiconductor.

The radio frequency oscillator 104 is electronically coupled to a signal splitter 105, which is further electronically coupled to the transmitter 102 and a phase shifter 106. The splitter 105 receives the electronic signal generated by the radio frequency oscillator 104 and outputs two electromagnetic signals, one to the transmitter 102 and one to the phase shifter 106. The electromagnetic signals provided by the splitter 105 are identical and have the same frequency, but reduced amplitude, compared to that of the electromagnetic signal generated by the radio frequency oscillator 104. The transmitter 102 emits an electromagnetic signal generated by the electronic signal from the splitter 105. When a sample material 101 is provided between the transmitter 102 and receiver 103, the transmitter 102 is able to transmit the electromagnetic (radio frequency) signal to the receiver 103.

Figure 2A:
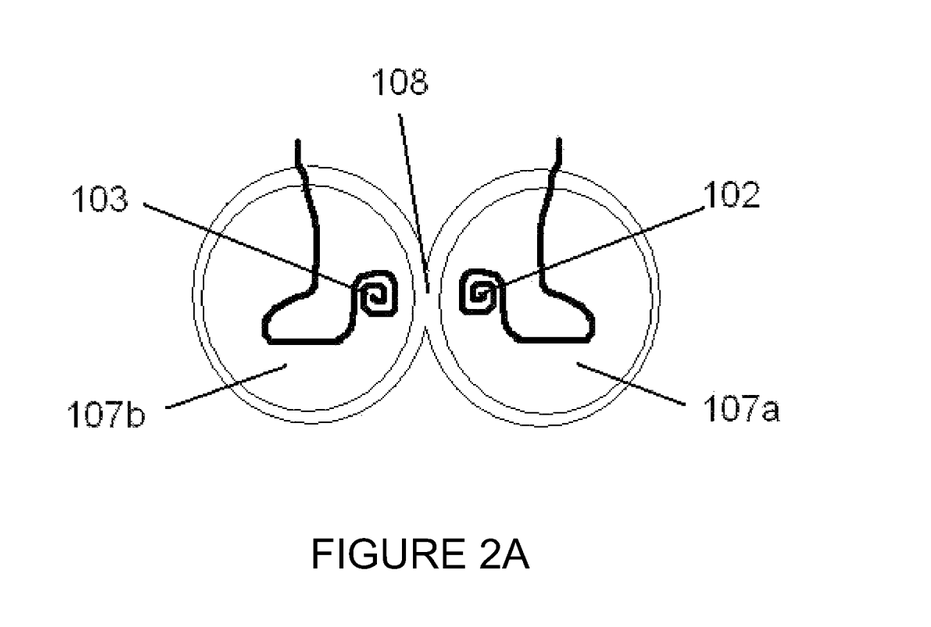
FIGS. 2A and 2B illustrate a specific embodiment of the measurement system provided herein. The receiving antenna and transmitting antenna are shown in their respective shielded cavities in FIG. 2A, and the sample is shown in place for measurement in FIG. 2B.
Figure 2B:
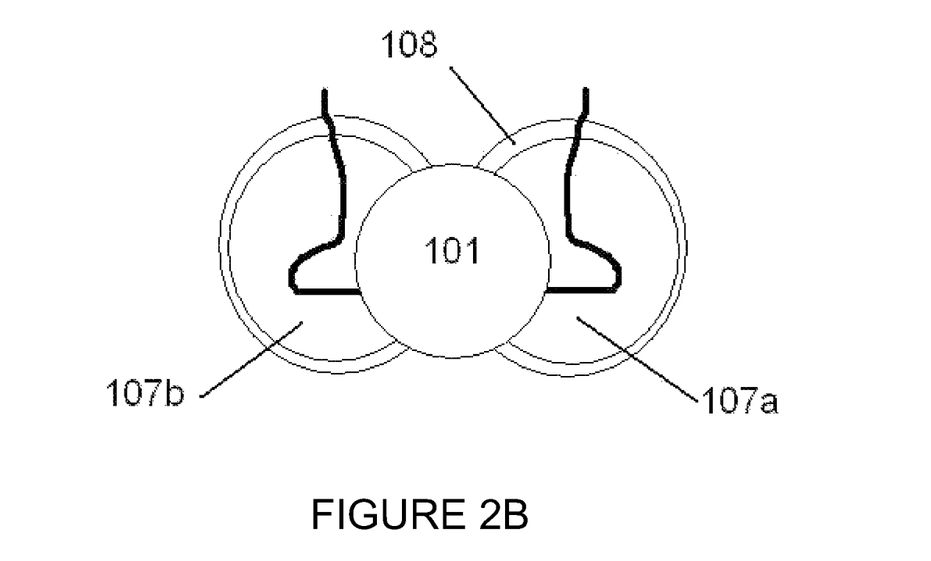

The photoconducting sample material 101 is positioned near the transmitter 102 and receiver 103 which are mounted in shielded cavities 107a and 107b, respectively (shown in FIG. 1 and FIGS. 2A and 2B). The transmitter 102 and receiver 103 are shielded from each other by an electromagnetic shield 108, such as a metallic electromagnetic shield, wherein the electromagnetic shield 108 is configured so that the electromagnetic (radio frequency) energy transmitted by the transmitter 102 passes through the sample 101 before being collected by the receiver 103. The photoconducting sample material 101 is placed in the path of the radio frequency signal between the transmitter 102 and receiver 103, thereby providing a bridge between the transmitter 102 and receiver 103. The transmitter 102 and receiver 103 are electromagnetically coupled via the sample 101, which acts as a waveguide, also referred to herein as a "conduit," for radio frequency energy transfer between the transmitter 102 and receiver 103.

As shown in FIG. 1, a pulsed light source 109 is placed in optical communication with the photoconducting sample material 101 to direct pulsed light 110 to the sample 101. The energy from the pulsed light source 109 is absorbed by the sample material 101 and induces photoconductivity by creating photocarriers (electron-hole pairs) within the sample material 101. The initial photoconductivity of the sample material 101 induced by the pulsed light 110 is reduced as the photocarriers recombine. The changing photoconductivity of the sample 101, due to its changing density of excess photocarriers, modulates the radio frequency signal passing through the sample material 101 between the transmitter 102 and receiver 103, such that the amplitude of the radio frequency signal received by the receiver 103 tracks the photocarrier recombination rate, also referred to herein as the photocarrier lifetime, in real time. This radio frequency signal, modulated by the excess photocarrier density of the sample material 101, is received by the receiver 103. In one embodiment, the photoconducting sample material 101 can be a doped semiconductor, such as a semiconductor containing impurities. In this case, the photocarrier lifetime can be referred to as the minority carrier lifetime, and the radio frequency signal received by the receiver 103 is modulated by the minority carrier density of the sample 101.

The receiver 103 is electronically coupled to an amplifier 111. The receiver 103 receives the radio frequency signal, modulated by the photocarrier density of the sample material 101, and then generates an electronic data signal which is transmitted to the amplifier 111 which amplifies the electronic signal. Optionally, the amplifier 111 comprises two amplifiers in series. The amplifier 111 is further electronically coupled to a signal mixer 112 which receives the amplified data signal.

As shown in FIG. 1, the signal mixer 112 is further electronically coupled to an amplifier 113, which is additionally electronically coupled to a phase shifter 106. The phase shifter 106 receives an electromagnetic signal from the signal splitter 105. This electromagnetic signal is the same as the radio frequency signal received by the transmitter 102 from the splitter 105. The phase shifter 106 shifts the phase of the input electromagnetic signal a fixed amount, as determined by the user, such that the electronic signal output by the phase shifter 106 is in-phase with the data signal received by the mixer 112. In one embodiment, this phase shift is manually set by the user. In another embodiment, the phase shift is carried out automatically by means known to the art. The phase-shifted electronic signal output by the phase shifter 106 is amplified by the amplifier 113 and received by the mixer 112. Thus, the mixer 112 receives the following two inputs: 1) the electronic data signal from the receiver 103 amplified by amplifier 111; and 2) an electronic reference signal from the signal splitter 105 corresponding to the transmitted radio frequency, which is amplified by an amplifier 113 and phase-shifted by phase shifter 106.

In an alternative embodiment, the phase shifter 106 can be located on the receiving side of the apparatus, such that the phase shifter 106 shifts the phase of the data signal provided by the receiver 103 to phase-match the data signal with that of the second input of the mixer 112. It is well known to one of ordinary skill in the art that the function of the phase shifter, to phase match one signal with another, can be achieved in various configurations of the phase shifter 106 relative to the other components of the TMPCD measurement system 100.

The mixer 112 is an art-known-device that creates output signals representing the multiplication of the two input electronic signals: the data signal based on the received radio frequency signal, modulated by the photocarrier density of the sample material 101, and amplified by the amplifier 111; and the amplified and phase-shifted reference signal. The mixer 112 performs an analogue multiplication of the two input signals and creates two electronic signals; a time-varying, high frequency signal having a frequency that is twice the frequency of the radio frequency oscillator 104, and a time-varying DC signal that changes with the photoconductivity of the sample and is a function of the time-varying photocarrier density of the sample 101. The inverse of the logarithmic slope of this electronic signal provides the photocarrier lifetime of the sample 101, or the minority carrier lifetime in the case of a doped semiconducting sample 101. The DC transient signal from the mixer 112 comprising the photocarrier density information is transmitted to a display device 114. In an embodiment, the display device 114 can comprise an oscilloscope. The oscilloscope 114, or other display device, can optionally be operationally coupled to a computer for further analysis of the data.

In one embodiment, the transmitter 102, the receiver 103, the electromagnetic shield 108, shielded cavities 107a and 107b, and the sample material 101 are enclosed in an enclosure that allows only the pulsed light 110 from the pulsed light source 109 to illuminate the sample. For example, these elements can be enclosed in a black box, metal shield, or other appropriate enclosure as determined by one of ordinary skill in the art.

The TMPCD measurement systems provided herein are superior to current available recombination lifetime measurement techniques because they provide the following improvements:

1. High measurement rate: Rapid measurement of carrier recombination lifetime will allow an improved sampling rate in the production line environment.

2. Large dynamic range: The term "dynamic range" refers to the range of response of a measurement system over which the measurement signal is proportional to conductivity of the sample. A large and/or high dynamic range refers to a case in which the output signal is proportional to the sample conductivity over one or more orders of magnitude of the latter. The dynamic range improvement of the present system over microwave reflection used in other methods will allow injection-level spectroscopy analysis of defects in materials.

3. Short lifetime resolution: This feature allows measurement of materials having shorter recombination lifetimes, such as compound semiconductors and thin film silicon.

The TMPCD measurement system provided herein also requires minimal tuning and adjustment, and provides measurements of photocarrier recombination lifetime that are very rapid. For example, high quality measurements can be made in several seconds in most cases, depending on the repetition rate of the laser or pulsed light source. The latter is significant in terms of signal averaging. The acquisition time of the TMPCD system is competitive or superior to of that of other commercially-available techniques.

The measurement system provided herein can be further understood by the following non-limiting examples.

EXAMPLES

Example 1

A TMPCD Embodiment

A TMPCD measuring device was constructed in accordance with the schematic representation of the TMPCD setup shown in FIG. 1. The specific embodiment of the TMPCD measurement system used for analyzing the samples discussed in Examples 2, 3 and 4 is described here, and shown in part in FIGS. 2A and 2B.

Transmitter 102 and receiver 103 are coil antennas. They were embedded in two adjacent metal enclosures 107a and 107b, respectively. Transmitter 102 and receiver 103 were isolated from each other by an electromagnetic shield 108 made of metal (see FIG. 1 and FIGS. 2A and 2B). The transmitter 102 was driven by a variable frequency oscillator 104 at a resonant frequency (f) that was adjustable by means of a series, variable tuning capacitor. The operating frequency was adjusted to the natural frequency of the fabricated antenna system (approximately 600 MHz). The passive, receiving circuit, including receiver 103 was adjusted to the same frequency as the transmitter 102 by means of a series capacitor. Virtually no signal was received by the receiver 103 unless a sample 101 bridged the two regions comprising the transmitter 102 and receiver 103 (see FIG. 2B). The sample material 101 acted as a waveguide to conduct the electromagnetic signal transmitted by the transmitter 102 to the receiver 103. The signal received by the receiver was amplified by 40 dB by the amplifier 111 which comprised two amplifiers in series. The received signal was a function of the photo conductivity of the sample material 101 and changed in accordance with the light-induced photoconductivity in the sample. Thus, the transmission of the electromagnetic signal from the transmitter 102 to the receiver 103 was modulated by the photoconductivity of the sample due to the density of photocarriers induced by the pulsed light 110.

Under pulsed optical excitation of the sample 101, the data signal from the receiver was amplified by amplifier 111 and directed to a first input terminal of the mixer 112 in order to extract the DC transient component that comprised the photocarrier density information due to the induced, time-varying photoconductivity of the sample. A portion of the signal from the oscillator 104 was passed through the phase shifter 106, amplified by amplifier 113, and directed to a second input terminal of the mixer 112. When the two inputs were in phase, the mixer 113 output produced a signal of 2f and a DC-transient component, both of which decayed with the photocarrier population in the sample. By digitizing, analyzing and storing the dc-transient response, the carrier lifetime was extracted from the data. The carrier lifetime was determined by fitting the slope of the semilog plot of the rectified receiving antenna output (e.g. the DC-transient component) voltage versus time.

Example 2

TMPCD and RCPCD Measurements of $Si_3N_4$/Silicon

Figure 3:
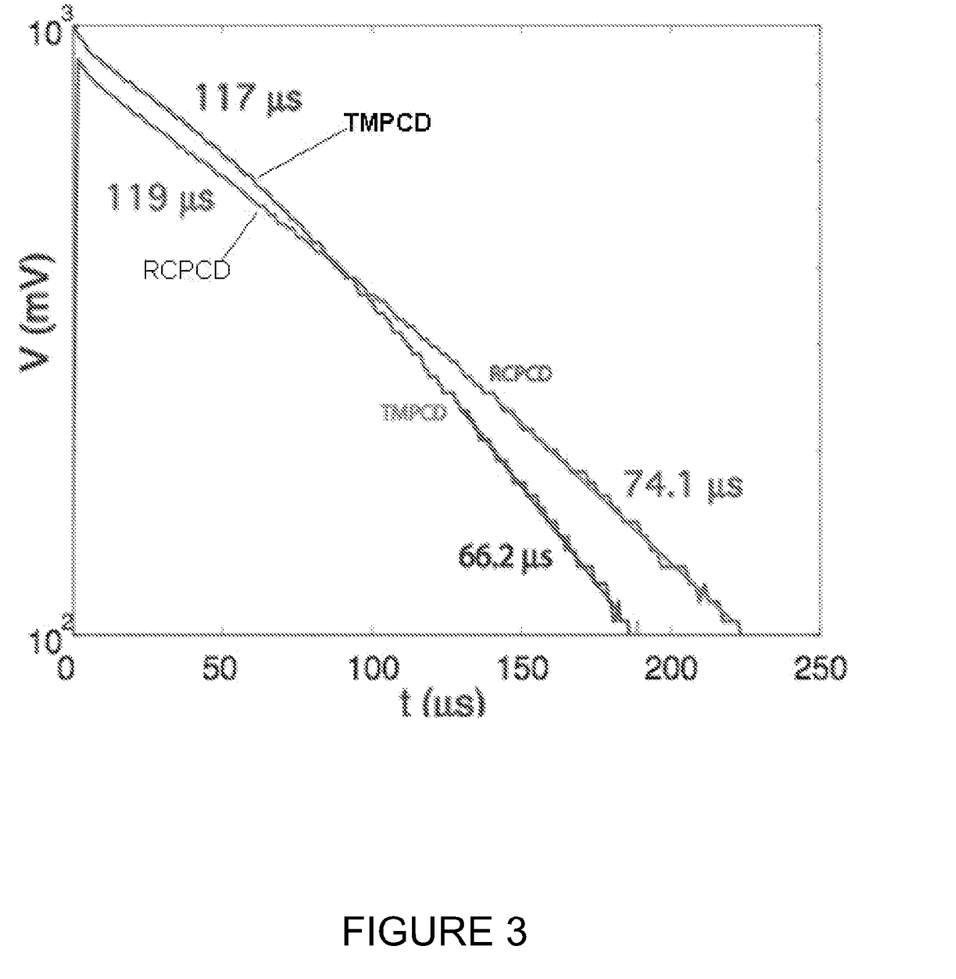
FIG. 3 shows the transient photoconductive decay measurements of a float zone grown silicon wafer passivated with $Si_3N_4$. The results shown in FIG. 3 were obtained using the RCPCD measurement system described in U.S. Pat. No. 5,929,652 and the TMPCD measurement system provided herein.

The TMPCD measurement system described in Example 1 was used to measure the photoconductive decay of a float zone grown silicon wafer, passivated with $Si_3N_4$. FIG. 3 shows data measured with both Resonance Coupled Photoconductive Decay (RCPCD) and TMPCD systems using the same pulsed light source (a mini-YAG laser) operating in the frequency-doubled (532 nm) mode. The pulse width of the laser pulse was about 5 ns full-width-half-maximum. The excitation intensity was adjusted to about 5 $mJ/cm^2$ and was identical for each measurement. The two-component decay, seen in both curves as a change in slope, is typical of a silicon sample pulsed into higher injection. The term "injection level" refers to the ratio of injected carrier density to the background doping density. Low injection relates to a case in which the injected carrier density is much less than the background doping density level. High injection relates to the case in which the injected carrier density is larger than the background doping density level.

At high injection, the deep impurity levels that dominate recombination become partly filled with minority carriers. Therefore, the recombination lifetime at high injection is larger than at low injection. The recombination values measured by the TMPCD system are about 117 µs at high injection and 66 µs at low injection. The recombination values measured by the RCPCD system are 119 µs at high injection and 74 µs at low injection.

The TMPCD data shows a steeper drop in the initial (t=0) decay time than does the RCPCD data. This steep feature at t=0 is indicative of surface recombination and has been explored by Ahrenkiel et al. ["An optical technique for measuring surface recombination velocity", *Solar Energy Materials and Solar Cells* 93, 645-649, 2009].

Example 3

Rise Time and Lifetime Response of TMPCD Versus RCPCD

Figure 4:
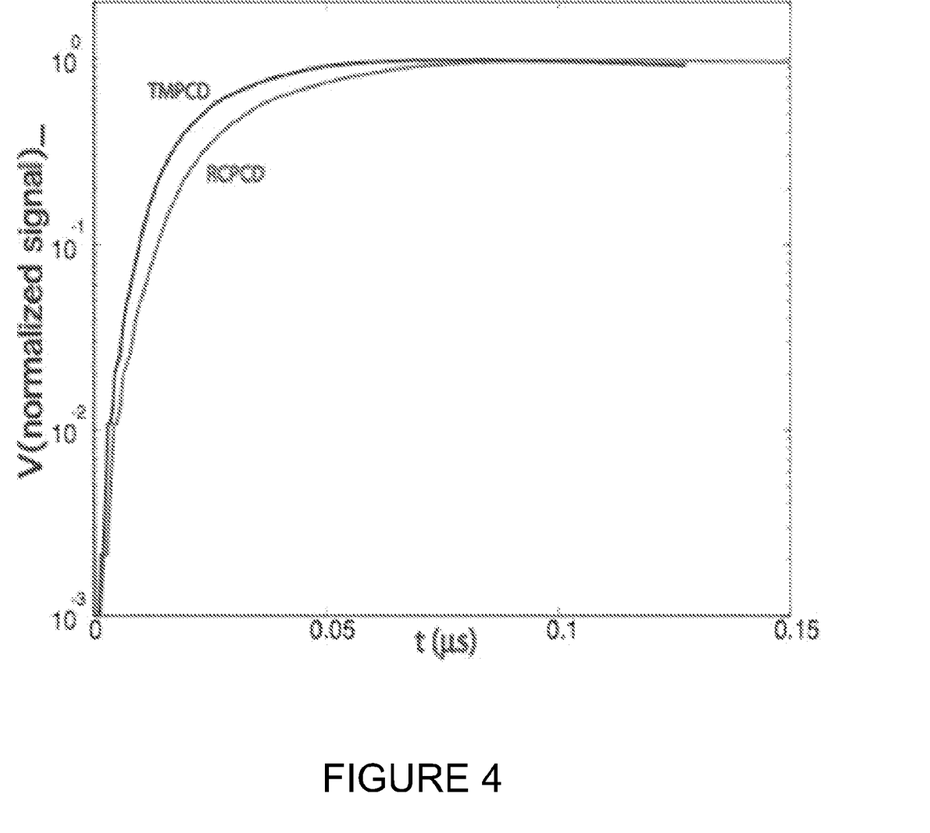
FIG. 4 graphs the rise time response data of a bare silicon wafer measured with both the TMPCD and RCPCD measurement systems using the same pulsed optical light source and pulse intensity.
Figure 7:
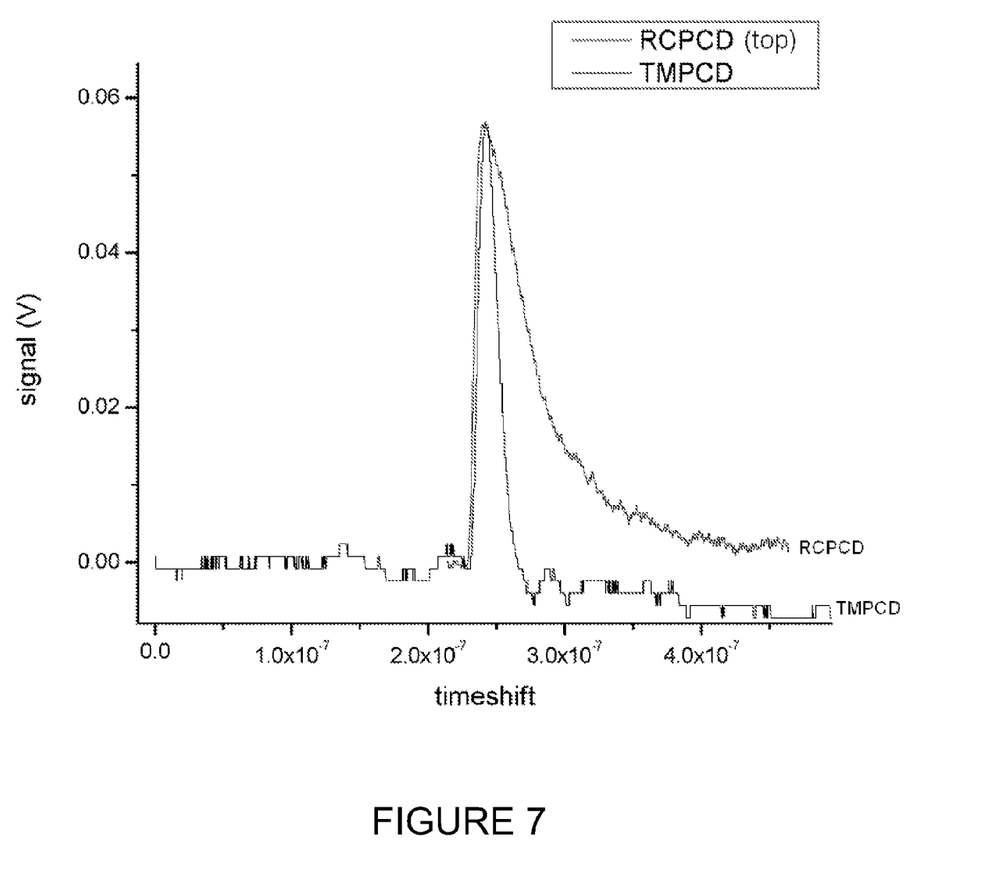
FIG. 7 shows a comparison of timeshift measurements of TMPCD and RCPCD performed on an amorphous silicon thin film.

The TMPCD measurement system described in Example 1 was used to measure the photoconductive decay of a bare silicon wafer. FIG. 4 shows the photoconductive decay curve near t=0 so that the response time is shown in more detail. The two curves shown in FIG. 4 correspond to measurements obtained using the TMPCD measurement system provided herein and the RCPCD measurement system. The data have been normalized so that the relative maximum of each curve corresponds to unity. Similarly, FIG. 7 shows a comparison of the lifetime response of the TMPCD measurement system provided herein and a RCPCD measurement system performed on an amorphous silicon thin film. As shown in FIG. 7, the TMPCD pulse returns to the baseline level much more quickly and sharply than the corresponding RCPD pulse. The data in FIG. 4 shows that the rise time, also referred to herein as the "response time" of TMPCD is faster than that of the RCPCD. The TMPCD pulse rise is very close to the integrated time dependence of the excitation pulse (e.g. a wave with a Gaussian dependence having a full-width-half-maximum of 5 ns). The RCPCD pulse rise time is much longer, as it takes 30 to 40 ns longer to reach 90% of its maximum, compared to the TMPCD curve.

The source of this improvement appears to be that the sensitivity of the RCPCD measurement system relies on a very high quality factor (Q) of the coupling circuit, whereas the TMPCD measurement system does not. It is well known from circuit theory that as the Q increases, the system response time increases. Therefore, much shorter lifetimes are measured by means of the TMPCD measurement system, demonstrating the ability to use this technique for thin films of silicon and compound semiconductors, providing a significant advantage over other techniques.

Example 4

Measurement of Carrier Lifetime of Substrate-Grown Thin Films

Figure 5:
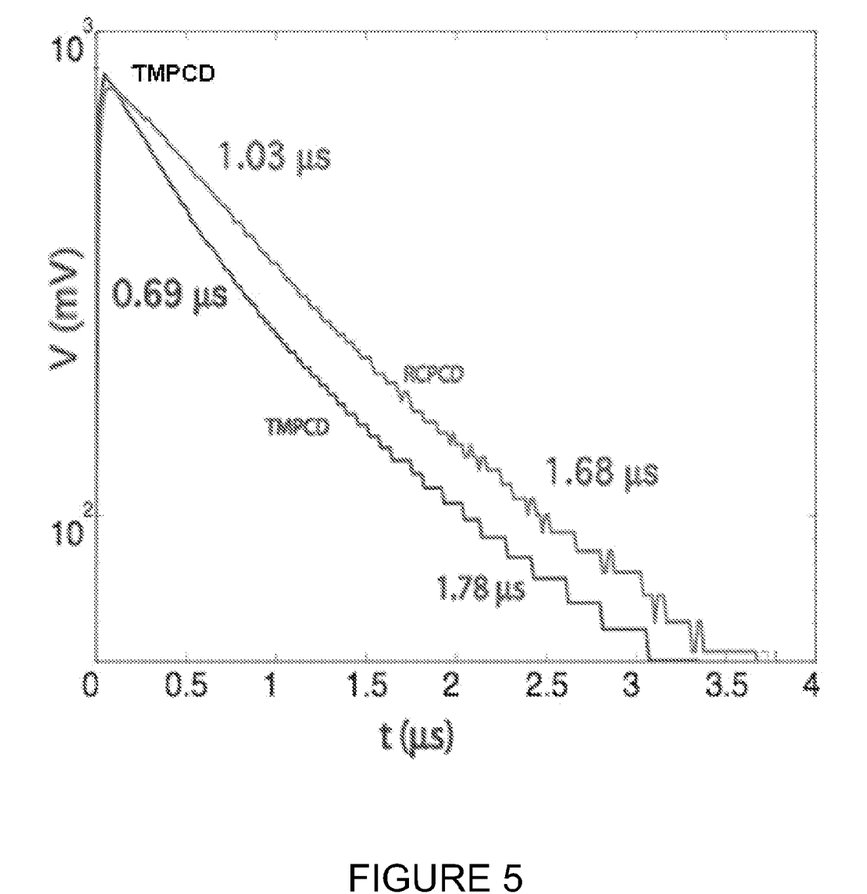
FIG. 5 graphs a comparison of TMPCD and RCPCD photoconductive decay measurements of a 4 mm thick InGaAs film grown on a semi-insulating InP substrate. The InGaAs film has a passivating epiaxial layer at each surface.

The TMPCD system described in Example 1 was used to measure the carrier recombination lifetime of a thin film grown on a substrate. FIG. 5 shows TMPCD data measured on a thin (~4 µm) epitaxial film of InGaAs grown on a semi-insulating InP substrate. The active layer was grown between thin, quaternary confinement, passivating epi-layers. The TMPCD data shows a shorter lifetime at high injection than shown for RCPCD. At low injection, the lifetimes agree quite closely.

In summary, the results of Examples 2-4 indicate that TMPCD has characteristics that are useful for online and/or rapid characterization of photovoltaic materials. The TMPCD technique and measurement system provides a significant advantage to photovoltaic production applications in that material measurement time is reduced. Furthermore, because of the faster response of the TMPCD system, the lifetime measurement techniques described here are applicable to thin film materials with intrinsically shorter lifetimes. Finally, the performance over a wider range of injection levels provides more diagnostic information than microwave reflection methods.

Example 5

Solar Cell Performance versus Carrier Recombination Lifetime

The dominant loss mechanism that affects low-cost silicon photovoltaic cells is impurity-related or defect-related Shockley-Read-Hall (SRH) recombination. To illustrate, results from a photovoltaic (PV) device simulation model that links efficiency to recombination lifetime in a typical silicon solar cell were calculated. This simulation used the silicon industry standard device structure as the model for the calculation. Similar trends are transferrable to all of the wafer and thin film products that are currently being produced by the industry.

A number of modeling programs are useful in predicting the operating characteristics of silicon-based PV cells. In this example, SimWindows, which is a software package developed at the University of Colorado, Boulder, was used. The typical industrial cell structure is based on a boron-doped p-type wafer with a resistivity in the 1- to 10-ohm-cm range. The cell emitter is formed by phosphorous diffusion such that a thin, highly conducting layer is formed. The emitter has a sheet resistivity of about 50 ohms/square or less. This is followed by forming a low-resistance ohmic back-contact and a grid contact to the emitter. An antireflection coating is deposited on the emitter surface to optimize the transmission of light into the active region of the cell. Prior to the back-contact formation, a $p^+$ layer is diffused into the back surface to provide a back-surface field (BSF). The BSF repels electrons and prevents recombination at the back contact. This cell design is the industry standard and is used for low-cost, silicon manufacturing.

Many material parameters, such as carrier mobility, were not strongly reduced by impurity scattering. For example, the electron mobility decreased by about a factor of 15 as the ionized donor density increased from $1 \times 10^{14}$ cm$^{-3}$ to $1 \times 10^{19}$ cm$^{-3}$. In contrast, the electron lifetime decreases by three or four orders of magnitude because of recombination at various impurities and structural defects. The latter include grain boundaries, surface defects, and dislocations. Another finding was that the bulk lifetime decreased inversely with certain transition-metal impurity concentrations for densities larger than about $1 \times 10^{12}$ cm$^{-3}$. Various refining processes increased the recombination lifetime by many orders of magnitude as certain impurities were removed. Annealing in hydrogen gas passivated some impurities and grain boundaries. However, all of these treatments add to the cost of the cell.

Figure 6:
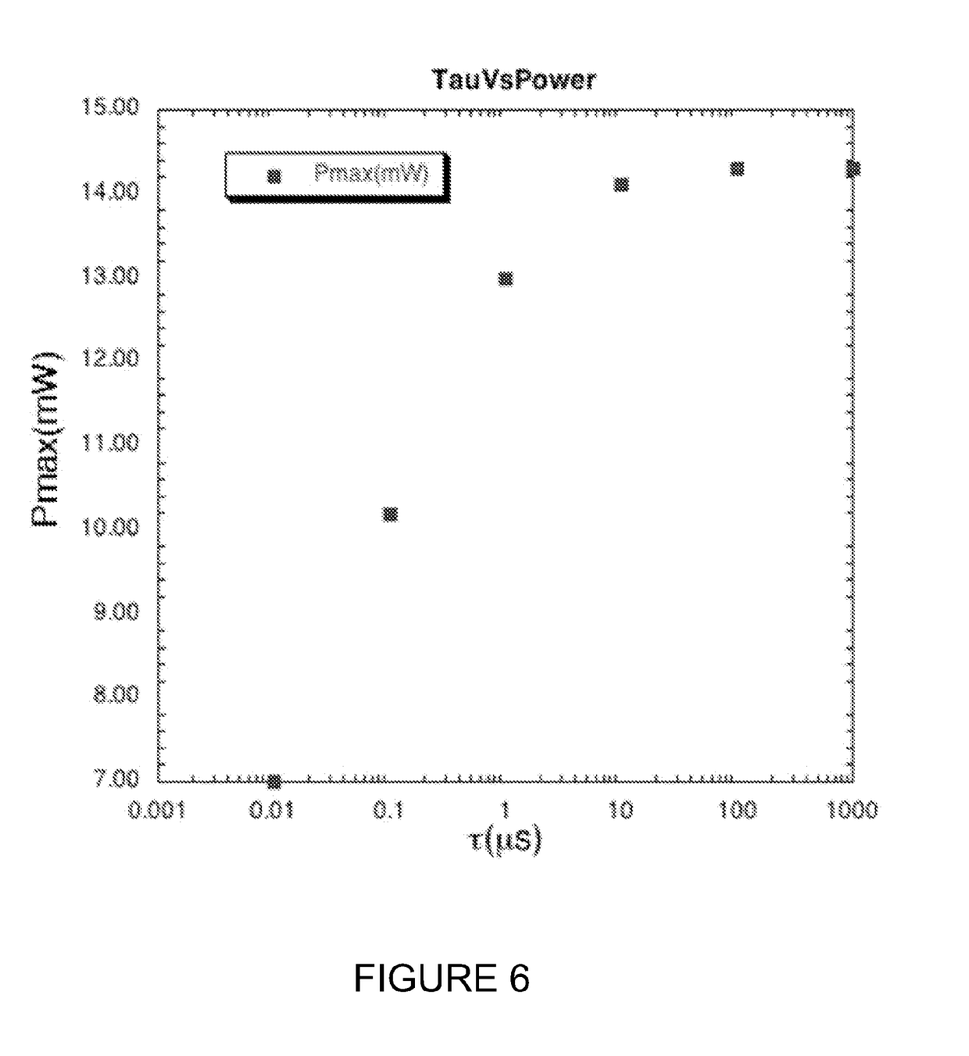
FIG. 6 graphs performance of a standard n+/p wafer silicon solar cell with an input flux of AM1.5 as a function of the base lifetime.

FIG. 6 shows a calculation of the cell performance at air mass 1.5 (AM1.5) illumination as a function of the base lifetime. The AM1.5 spectrum produces about 100 mW/cm² of solar flux and approximates the peak of solar flux found in the Northern Hemisphere. In the simulation, the base region is set to have resistivity of 3-ohm-cm with a base-electron lifetime that varies over six orders of magnitude. The base lifetime was set at values of 10 ns, 100 ns, 1 μs, 10 μs, 100 μs, and 1 ms for six performance calculations shown in FIG. 6. These values span a range of silicon lifetime found in commercial wafers. The low lifetimes correspond to low quality metallurgical grade silicon (MGS). The millisecond lifetime corresponds to the highest-quality float-zone-grown ingots. The emitter doping level was adjusted to $1 \times 10^{19}$ cm$^{-3}$ in the simulation, with an average thickness of 0.075 μm, giving a sheet resistivity of about 40 ohms/square. The incident optical insolation used in the calculation was the air mass 1.5 spectrum (AM1.5).

It can be seen from FIG. 6 that cell efficiency increased very rapidly for base lifetimes varying from 10 ns to 1 μs. The maximum efficiency was in the range of 14-15%, which is comparable to that produced by industrial, low-cost cells. This is a lifetime range that is commonly found in ribbon and thin film silicon. Additionally, this range overlaps the range of lifetimes found in commercial cast-ingot silicon. For lifetimes between 10 μs and 1 ms, the performance changed slowly and did not change in the 100 μs to 1 ms range. This behavior is a characteristic of this particular cell design, which is used in low-cost fabrication. Other more complicated designs exist, such as back-contact cells that require longer lifetimes, and can increase the cell output to the theoretical maximum. That technology is equally dependent on lifetime but in a much higher lifetime range (e.g. 1 ms or greater).

The calculations provided in FIG. 6 provide an illustration of the importance of carrier recombination lifetime on photovoltaic cell efficiency. A large fraction of the commercial cells produced for residential applications have carrier lifetimes in the range shown in FIG. 6.

Example 6

TMPCD Operation

FIG. 1 shows a schematic representation of the TMPCD measurement system provided herein, and Example 1 provides a description and illustration of a specific embodiment that was used to make the measurements provided in Examples 2-4. As shown in FIG. 1, the sample material 101 bridges the transmitter 102 and receiver 103 coils directing the electromagnetic wave (EMW) from the transmitter antenna 102 to the receiving antenna 103. Without being bound by theory, it is believed a portion of the transmitted wave penetrates the sample material 101 and is "trapped" by total internal reflection. As such, the wave travels along the lateral direction of the sample material 101, and a portion of that wave "leaks" out of the bottom surface to the receiving antenna 103. The transmission of an EMW in a semiconducting medium has recently been calculated by Ahrenkiel et al. [*J. Vac. Sci. Technol. B.*, 26 (2008)]. The absorption coefficient of the EMW wave is given by:

$$\alpha = \omega \sqrt{\frac{\mu\varepsilon}{2}\left(\sqrt{1+\frac{\sigma^2}{\omega^2\varepsilon^2}}-1\right)}$$

where α is the attenuation coefficient of the electric vector in the medium:

$$E = E_0 \exp(-\alpha x)\exp[i(\omega t - \beta x)].$$

When the conductivity, σ, is increased by external photoexcitation, the E-vector is component of the EMW is attenuated. At the frequency used in Examples 1-4 (~600 MHz), the attenuation factor is fairly small, but the large path produced by wave trapping amplifies the attenuation effect. This longer path length provides the relatively larger signals obtained by the TMPCD measurement system provided herein.

While a number of exemplary aspects and embodiments have been discussed above, those of ordinary skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

All references throughout this application are hereby incorporated by reference herein in their entireties to the extent not inconsistent herewith, as though individually incorporated by reference. All patents and publications mentioned in the specification are indicative of the levels of skill of those skilled in the art to which the measurement system provided herein pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art.

Every formulation or combination of components described or exemplified can be used to make and use the measurement system provided herein, unless otherwise stated. One of ordinary skill in the art will appreciate that methods, device elements, starting materials, and synthetic methods other than those specifically exemplified can be employed to make and use the measurement system without resort to undue experimentation. All art-known functional equivalents, of any such methods, device elements, starting materials, and synthetic methods are intended to be included within the scope of the present disclosure. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The measurement system illustratively described herein suitably can be practiced in the absence of any element or elements, limitation or limitations which are not specifically disclosed herein.

The invention claimed is:
1. A system for measuring photocarrier recombination lifetime of a photoconductive sample material, said system comprising:

a) a transmitter antenna able to transmit an electromagnetic signal;
b) the sample material in electromagnetic communication with the transmitter antenna, wherein the electromagnetic signal is transmitted from the transmitter antenna through the sample material;
c) a light source in optical communication with the sample material, wherein the light source is able to generate photocarriers in the sample material and wherein the photocarriers modify the electromagnetic signal transmitted through the sample; and
d) a receiver antenna able to receive the modified electromagnetic signal from the sample material; and
e) analyzing means for analyzing the modified electromagnetic signal received by the receiver antenna and determining the photocarrier recombination lifetime.

2. The system of claim 1 wherein said electromagnetic signal is a radio frequency signal.

3. The system of claim 2 wherein said radio frequency signal has a frequency at or between about 400 MHz and 700 MHz.

4. The system of claim 2 further comprising a radio frequency oscillator in electrical connection with said transmitter antenna.

5. The system of claim 4 further comprising:
a) a signal splitter electrically coupled with the radio frequency oscillator;
b) a signal mixer placed in direct or indirect electronic signal communication with the receiver antenna and the signal splitter, wherein the signal splitter provides a first electromagnetic signal to the transmitter antenna and a reference signal to the signal mixer, and wherein the signal mixer receives a data signal from the receiver antenna; and
c) means for comparing the data signal and reference signal received by the mixer.

6. The system of claim 5 further comprising a phase shifter in electronic signal communication with the signal splitter, the receiver antenna, or both, wherein the phase shifter matches the phases of the reference signal and data signal.

7. The system of claim 5 further comprising a first amplifier in direct or indirect electronic signal communication with the receiver antenna, wherein said first amplifier is able to amplify the data signal from the receiver antenna and transmit the amplified data signal to the signal mixer.

8. The system of claim 7 further comprising a second amplifier in direct or indirect electronic signal communication with the signal splitter, wherein said second amplifier is able to amplify the reference signal from the signal splitter and transmit the amplified reference signal to the signal mixer.

9. The system of claim 1 wherein the light source is a pulsed light source.

10. The system of claim 1 wherein the analyzing means comprises a graphical display device for displaying information representing carrier lifetime of a sample.

11. The system of claim 1 further comprising an electromagnetic shield positioned between the transmitter antenna and receiver antenna so that the receiver antenna only receives electromagnetic signals transmitted through the sample material.

12. The system of claim 1 wherein the generated photocarriers modify the amplitude of the electromagnetic signal transmitted through the sample.

13. A method for measuring photocarrier recombination lifetime of a photoconductive sample material comprising:
a) positioning the sample material between a transmitter antenna and a receiver antenna;
b) transmitting an electromagnetic signal from the transmitter antenna through the sample material;
c) generating photocarriers in the sample material, wherein said photocarriers modify the electromagnetic signal transmitted through the sample material;
d) receiving the modified electromagnetic signal with the receiver antenna; and
e) analyzing the modified electromagnetic signal received by the receiver antenna to determine the photocarrier recombination lifetime of the sample material.

14. The method of claim 13 wherein said electromagnetic signal is a radio frequency signal.

15. The method of claim 14 wherein said radio frequency signal has a frequency at or between about 400 MHz and 700 MHz.

16. The method of claim 13 further comprising generating photocarriers which modify the amplitude of the electromagnetic signal transmitted through the sample, and analyzing the amplitude-modified signals received by the receiver antenna to determine the photocarrier recombination lifetime of the sample.

17. The method of claim 13 further comprising generating a reference signal identical to the electromagnetic signal and comparing the reference signal to the modified electromagnetic signal received by the receiver antenna.

18. The method of claim 17 further comprising generating a data signal from the modified electromagnetic signal received by the receiver antenna and matching the phases of the reference signal and data signal.

19. The method of claim 18 further comprising amplifying the reference signal, data signal, or both.

20. A system for measuring carrier recombination lifetime of a semiconductor sample material, said system comprising:
a) a transmitter antenna able to transmit an electromagnetic signal;
b) the sample material in electromagnetic communication with the transmitter antenna, wherein the electromagnetic signal is transmitted from the transmitter antenna through the sample material;
c) an energy source positioned so as to radiate energy toward the sample material, wherein the radiated energy is able to generate carriers in the sample material, and wherein the generated carriers modify the electromagnetic signal transmitted through the sample;
d) a receiver antenna able to receive the modified electromagnetic signal from the sample material; and
e) analyzing means for analyzing the modified electromagnetic signal received by the receiver antenna and determining the carrier recombination lifetime.

21. The method of claim 13 further comprising shielding the transmitter antenna from the receiver antenna so that the receiver antenna only receives electromagnetic signals transmitted through the sample material.

* * * * *